United States Patent [19]
Izuta et al.

[11] Patent Number: 5,609,287
[45] Date of Patent: Mar. 11, 1997

[54] SOLDER MATERIAL, JUNCTIONING METHOD, JUNCTION MATERIAL, AND SEMICONDUCTOR DEVICE

[75] Inventors: Goro Izuta, Amagasaki; Shunichi Abe, Itami; Yoshirou Nishinaka, Itami; Katsuyuki Fukutome, Itami; Naoto Ueda, Itami; Toshio Takeuchi, Itami; Yoshihiro Kashiba; Masaaki Namatame, both of Amagasaki, all of Japan

[73] Assignee: Mitsubishi Denki Kabushiki Kaisha, Tokyo, Japan

[21] Appl. No.: 335,995

[22] Filed: Nov. 8, 1994

Related U.S. Application Data

[63] Continuation of Ser. No. 955,307, Oct. 1, 1992, Pat. No. 5,375,295.

[30] Foreign Application Priority Data

| Oct. 4, 1991 | [JP] | Japan | 3-257282 |
| Jan. 7, 1992 | [JP] | Japan | 4-000662 |
| May 26, 1992 | [JP] | Japan | 4-133468 |

[51] Int. Cl.$^6$ .................................................. H01L 21/58
[52] U.S. Cl. ........................................................ 228/123.1
[58] Field of Search ........................ 228/122.1, 123.1, 228/180.22

[56] References Cited

U.S. PATENT DOCUMENTS

| 4,746,055 | 5/1988 | Ingram et al. | 228/123.1 |
| 4,783,722 | 11/1988 | Osaki et al. | 439/74 X |
| 4,810,671 | 3/1989 | Bhattacharyya et al. | 228/123.1 X |
| 4,914,814 | 4/1990 | Behvn et al. | 29/843 |
| 5,038,996 | 8/1991 | Wilcox et al. | 228/123.1 X |
| 5,186,383 | 2/1993 | Melton et al. | 228/180.22 |
| 5,372,295 | 12/1994 | Abe et al. | 228/123.1 |

FOREIGN PATENT DOCUMENTS

| 72756 | 6/1978 | Japan | 228/123.1 |

OTHER PUBLICATIONS

Anonymous Research Disclosure, Jul. 1988 No. 291–11 Kenneth Mason Publ., Ltd. England.

*Primary Examiner*—Kenneth J. Ramsey
*Attorney, Agent, or Firm*—Wolf, Greenfield & Sacks, P.C.

[57] ABSTRACT

A solder material comprises a first solder plate and a second solder plate having a thickness equal to or larger than 1 micron provided at the both surfaces of the first solder plate comprising material-having a lower melting point than the first solder or material which reacts with the first solder to produce an alloy having a lower melting point than the first solder.

A junctioning method comprise putting the above-described solder material inserted between two objects to be junctioned to each other; heating the solder material to a temperature higher than the melting point of the second solder or the alloy and lower than the melting point of said first solder thereby to melt the second solder or the alloy; and thereafter cooling or keeping the solder material at a temperature in the vicinity of the melting point thereby to junction the objects to be junctioned to each other. The second solder plate has preferably a thickness less than 5 microns and the first solder plate has preferably a thickness equal to or larger than 30 microns. By this construction, the interval between the objects to be junctioned can be controlled to a predetermined thickness and the stress functioning to the objects can be relaxed as well as there arises no positional deviation between the objects.

19 Claims, 12 Drawing Sheets

SOLDER MATERIAL, JUNCTIONING METHOD, JUNCTION MATERIAL, AND SEMICONDUCTOR DEVICE

This application is a continuation of application Ser. No. 07/955,307 filed on Oct. 1, 1992, now U.S. Pat. No. 5,372,295.

FIELD OF THE INVENTION

The present invention relate to a solder material, a junctioning method, a junction material, and a semiconductor device and, more particularly, to a solder material used in junctioning a semiconductor chip to a substrate material, and a junctioning method therefor, a junction material used therein, and a semiconductor device comprising a semiconductor chip junctioned to a substrate material by the junction material.

BACKGROUND OF THE INVENTION

FIG. 20 shows a prior art semiconductor device. In FIG. 20, reference numeral 1 designates a semiconductor chip, reference numeral 2 designates a substrate material such as a lead frame, and reference numeral 3 designates solder for junctioning the semiconductor chip 1 to the substrate material 2. In such a semiconductor device, a semiconductor chip 1 and a substrate material 2 are held putting the solder 3 therebetween, and the solder 3 is heated to be melted to a temperature higher than its melting point and thereafter it is cooled to junction the semiconductor chip 1 to the substrate material 2. This is a so called solder die-bonding method. Such kind of solder die-bonding method is disclosed in "Microassembly technique for a semiconductor device; Trikeps technical material No. 76 (July 1982)."

In the above-described prior art junctioning method for a semiconductor device, since the solder 3 is in a melted state at the junctioning, the interval between the semiconductor chip 1 and the substrate 2 after the junctioning becomes about 10 to 20 microns and even if a large quantity of solder 3 is supplied between the semiconductor chip 1 and the substrate material 2 so as to widen the interval therebetween, almost all the solder would be exhausted at the melting and it was difficult to control the interval at a desired value from the outside. In addition, the interval between the semiconductor chip 1 and the substrate material 2 is ought to be reduced due to the wetting and broadening of the solder 3 and if solder is supplementarily supplied, there arises a positional deviation of the semiconductor chip 1 accompanying the flow of the solder 3, resulting in a problem in the later wire bonding process.

As described above, it was impossible to stably control the interval between the semiconductor chip 1 and the substrate material 2 at a desired value. Further, when the anti-heat property is required for the junction part in the later process, the solder 3 having a melting point higher than the temperature for which the anti-heat property is required is used for the junctioning and, then the higher the melting point is, the higher the junction temperature is, thereby resulting in a large thermal stress occurring due to the difference in the thermal expansion coefficients between the semiconductor chip 1 and the substrate material 2. Especially, when a silicon semiconductor chip is used for the semiconductor chip 1 and a copper system lead frame is used for the substrate material 2, the thermal expansion coefficient of the copper system lead frame amounts to a value five times as that of the silicon semiconductor chip 1, causing a destruction of the semiconductor chip 1 due to the residual stress remaining direct after the junctioning and the thermal stress in the environment when used thereafter. This phenomenon is eminent for a semiconductor chip 1 having a size larger than three millimeters square. In addition, when compound semiconductor is used for the semiconductor chip 1, there may be a case where the semiconductor chip is damaged even when the thermal expansion coefficient difference between the semiconductor chip 1 and the substrate material 2 is low because the compound semiconductor is mechanically weak with relative to the silicon semiconductor, thereby leading to a large difficulty in the soldering.

SUMMARY OF THE INVENTION

It is a first object of the present invention to provide a solder material for junctioning a semiconductor chip to a substrate material and a junctioning method therefor that can relax the thermal stress applied to the semiconductor chip by keeping the interval between the semiconductor chip and the substrate material after the junctioning, at a desired value.

It is a second object of the present invention to provide a solder material and a junctioning method that can relax the thermal stress functioning to the semiconductor chip and can make no positional deviation between the objects to be junctioned occur as well as shorten the time required for solidification at solidifying the solder material by keeping the solder material at a temperature in the vicinity of the melting point.

It is a third object of the present invention to provide a junction material that can shorten the time for heating required for completing the junctioning between the semiconductor chip and the substrate material.

It is a fourth object of the present invention to provide a semiconductor device, a substrate material, and a junctioning method that can shorten the die-bonding time as well as prevent the peeling off of the semiconductor chip at the later wire bonding and molding process.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a solder material of the first aspect of the present invention, the solder material comprises a first solder layer, preferably having a thickness of larger than 30 microns, and second solder layers having a thickness of larger than or equal to 1 micron provided at the both surfaces of the first solder layer, respectively, comprising a material having a lower melting point than the first solder or a material which reacts with the first solder to produce an alloy of lower melting point than the first solder.

According to a junctioning method of the first aspect of the present invention, the junctioning method for a semiconductor device comprises putting the above-described junctioning solder material between objects to be junctioned, heating the solder material at a temperature higher than the melting point of the second solder or the melting point of the alloy generated by the second solder reacting with the first solder and lower than the melting point of the first solder, thereby to melt the second solder or the alloy, and thereafter cooling or keeping the temperature of the solder material at a temperature in the vicinity of the melting point, thereby to junction the objects to be junctioned.

In accordin with the first aspect of the present invention, since almost all the first solder is kept in a solid state in the heating and junctioning process, the interval between the objects to be junctioned can be controlled at a desired thickness, thereby the stress applied to the objects to be junctioned after the junctioning can be relaxed. Also, there arises no positional deviation between the objects to be junctioned.

According to a solder-material of a second aspect of the present invention, a solder material comprises a first solder, preferably having a thickness of larger than 30 microns, and a second solder provided at the both surfaces of the first solder having a thickness of less than 5 microns and larger than or equal to 1 micron comprising a material which reacts with the first solder thereby to produce an alloy having a lower melting point than the first solder.

According to a junctioning method of a second aspect of the present invention, a junctioning method comprises putting the above-described junctioning solder material between the objects to be junctioned, heating the solder material at a temperature higher than the melting point of the second solder or the alloy and lower than the temperature of the melting point of the first solder thereby to melt the second solder or the alloy, and thereafter cooling or keeping the solder material at a temperature in the vicinity of the melting point, thereby to junction the objects to be junctioned to each other.

In accordance with the second aspect of the present invention, similarly as according to the first aspect, the interval between the objects to be junctioned can be controlled at a desired thickness and thereby the stress applied to the objects to be junctioned after the junctioning can be relaxed, as well as there arises no positional deviation between the objects to be junctioned. In addition, the time required for the components which cause a lowered solidification point contained in the second solder being diffused from the second solder to the first solder, thereby to raise the solidification point is shortened, because the second solder layer is thin and the quantity of the above-described components is less amount, resulting in a short time required for occurring the solidification of the second solder.

According to a third aspect of the present invention, a junction material for junctioning a semiconductor chip to a substrate material comprises a triple layer structure including a high melting point junction material layer and low melting point junctioning material layers provided at the both surfaces of the high melting point junction material layer and the high melting point junction material layer comprises a porous one having continuous spaces therein.

According to a further third aspect of the present invention, a junction material for junctioning a semiconductor chip to a substrate material comprises a high melting point junction material layer and low melting point junction materials and the low melting point junction materials are filled up with in the continuous spaces provided in the porous high melting point junction material layer.

According to a yet further third aspect of the present invention, a junction material for junctioning a semiconductor chip to a substrate material comprises at least a high melting point junction material layer and at least a low melting point junction material layer and the both junction material layers are laminated in plural alternatively in the direction vertical to the direction junctioning the rear surface of the semiconductor chip and the front surface of the substrate material.

According to a still further third aspect of the present invention, a junction material comprises a high melting point junction material layer and a low melting point junction materials, and the high melting point junction material layer includes throughholes produced therein and the low melting point junction materials are provided inside the throughholes.

According to a yet further third aspect of the present invention, a junction material for junctioning a semiconductor chip to a substrate material comprises a high melting point junction material layer and low melting point junction materials and, the low melting point junction materials are buried in the grooves provided respectively on the front and rear surfaces of the high melting junction material layer in mesh configurations.

According to a still further third aspect of the present invention, a junctioning method for junctioning a semiconductor chip to a substrate material comprises producing high melting point junction material layers at the rear surface of the semiconductor chip and the front surface of the substrate material confronting to the rear surface of the semiconductor chip, respectively, and a low melting point junction material layer is inserted between the two high melting point junction material layers, the low melting point junction material layer is heated to a temperature lower than the melting point of the high melting point junction material to make the same in a melted state and to diffuse the low melting point junction material into the both high melting point junction material layers, thereby enabling junctioning the semiconductor chip to a substrate material.

According to a yet further third aspect of the present invention, a junctioning method for junctioning a semiconductor chip to a substrate material comprises inserting a high melting point junction material layer between a semiconductor chip and a substrate material, supplying liquid comprising volatile solvent including minute low melting point junction material particles between the rear surface of the semiconductor chip and the front surface of the high melting point junction material layer and between the rear surface of the high melting point junction material layer and the front surface of the substrate material, respectively, thereby occurring wetting and broadening of the liquid, and thereafter carrying out heating thereby to junction the semiconductor chip to the substrate material.

According to a still further third aspect of the present invention, a semiconductor device is constructed comprising a semiconductor chip and a substrate material, the junction material as described above being placed between the semiconductor chip and the substrate material, heating being carried out at a temperature higher than the melting point of the low melting point junction material layer and lower than the melting point of the high melting point junction material layer, thereby the semiconductor chip is junctioned to the substrate material.

In accordance with a third aspect of the present invention, the melted low melting point junction material is soaked into the spaces inside the high melting point junction material layer, whereby the diffusion area for the low melting point junction material is increased.

In accordance with a further third aspect of the present invention, the heating is conducted at the temperature as described above, and the low melting point junction material filled up with in the spaces inside the high melting point junction material layer is melted thereby to increase the diffusion area.

In accordance with a yet further third aspect of the present invention, due to the multi-layer structure of the both junction material layers, the diffusion to mutually inside the junction materials advances by the heating process as described above, whereby the composition of the whole solder is made uniform.

In accordance with a still further third aspect of the present invention, the diffusion area of the low melting point junction material is increased by that the low melting point junction materials in the throughholes provided inside the high melting point junctioning material layer are melted, whereby the wetting and broadening of the same occur.

In accordance with a yet further third aspect of the present invention, the low melting point junction materials buried in the grooves produced at the front and rear surfaces of the high melting point junction material layer in mesh configurations are melted, whereby the diffusion area is increased.

In accordance with a still further third aspect of the present invention, the low melting point junction material layer inserted between the both high melting point junction material layers which are previously provided at the rear surface of the semiconductor chip and the front surface of the substrate material confronting to the semiconductor chip, respectively, is heated to be melted and is diffused into the both high melting point junction material layers, whereby the semiconductor chip is junctioned to the substrate material.

In accordance with a yet further third aspect of the present invention, by the liquid comprising volatile solvent including minute low melting point junction material particles supplied between the rear surface of the semiconductor chip and the front surface of the high melting point junction material layer, and also by the liquid supplied between the rear surface of the high melting point junction material layer and the front surface of the substrate material, the wetting and broadening of the liquid occur, and when the heating process is conducted as described above, the semiconductor chip is junctioned to the substrate material.

In accordance with a still further third aspect of the present invention, a semiconductor device is obtained by inserting the junction material as described above between a semiconductor chip and a substrate material and heating is conducted at the above-described temperature, thereby the semiconductor chip is junctioned to the substrate material.

According to a fourth aspect of the present invention, a substrate material constituting a semiconductor device comprising a semiconductor chip and a substrate material junctioned to each other via junction material, has peripheral projecting part surrounding the four edges of the solder material at the die-pad portions of the substrate material for separating the excess low melting point solder from the side surface of the solder material of the triple-layer structure.

According to a further fourth aspect of the present invention, a substrate material constituting a semiconductor device comprising a semiconductor chip and a substrate material junctioned to each other via junction material, has a groove at a die-pad portion of the substrate material surrounding the four edges of the solder material so that the excess low melting point solder do not remain at the side surface of the solder material of the triple-layer structure.

According to a still further fourth aspect of the present invention, a junctioning method comprises oxidizing the excess low melting point solder remaining at the side surface of the solder material of the triple-layer structure, whereby the low melting point solder is heightened its melting point to enable its solidification.

In accordance with the fourth aspect of the present invention, excess low melting point solder is not required to be diffused, whereby the time required for heating is shortened and the peeling off of the semiconductor chip due to the re-melting is prevented.

DETAILED DESCRIPTION OF THE PREFERRED EMBODIMENTS

First Embodiment 1

Figure 1:
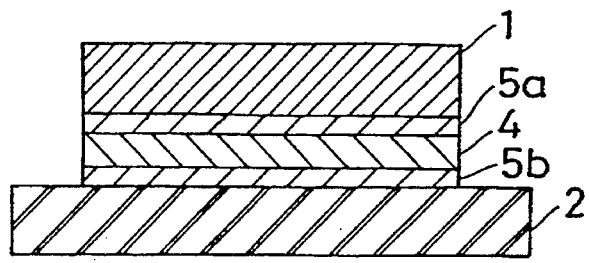
FIG. 1 is a schematic diagram showing a construction of a semiconductor device according to a first embodiment of the present invention.

FIG. 1 is a cross-sectional view showing a semiconductor device in accordance with a first embodiment of the present invention. In FIG. 1, reference numeral 1 designates a silicon semiconductor chip and reference 2 designates a substrate material such as copper system lead frame both as materials to be junctioned to each other. Reference numeral 4 designate first solder of high melting point comprising 95Pb-5Sn, and having a thickness of 50 microns. Reference numeral 5a and 5b designate second solder produced at the both surfaces of the first solder 4 by gilding, respectively, comprising 63Sn-37Pb and having a thickness of 10 microns. At the surfaces of the semiconductor chip 1 contacting with the solder, it is desired to apply metalization processing so as to improve the wetting property.

In producing this semiconductor device, the silicon semiconductor chip 1 and the substrate material 2 are overlapped with each other via solder materials 4, 5a, and 5b, and heating is carried out in a reductive ambient to a temperature higher than the melting point of the second solder 5a and 5b and lower than the melting point of the first solder 4, for example 200° C., thereby to melt only the second solder 5a and 5b. Thereafter, the temperature is lowered to solidify the second solder 5a and 5b thereby to junction the silicon semiconductor chip 1 and the substrate material 2. Then, because the first solder 4 is not almost melted, it will not be exhausted or transformed, to hold the initial thickness. As a result, the interval between the silicon semiconductor chip 1 and the substrate material 2 is held at a predetermined interval.

Figure 2:
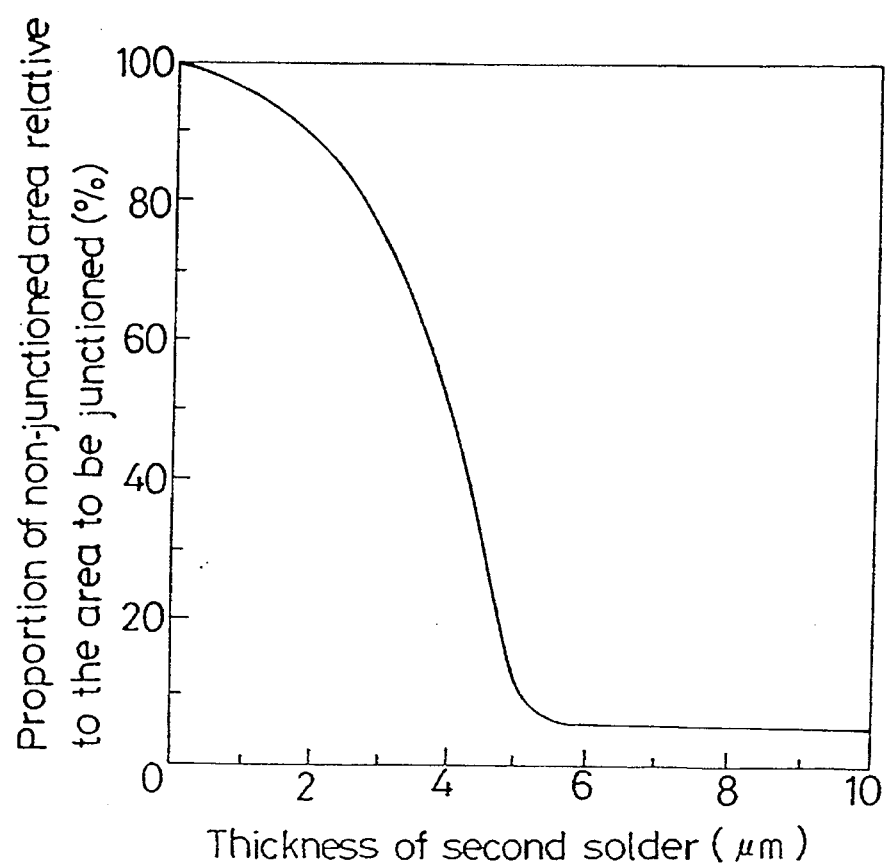
FIG. 2 is a diagram showing the characteristic of a relation between the thickness of the second solder and the junctioning property according to the first embodiment of the present invention.

FIG. 2 shows a characteristic representing the relation between the thickness of the second solder 5a and 5b and their junctioning property. The ordinate represents the proportion of the non-junctioned area relative to the area to be junctioned and the abscissas represents the thickness of the second solder 5a and 5b. As is apparent from the figure, when the thickness of the second solder 5a and 5b amount to above 5 microns, the proportion of the area of the non-junctioned area is reduced and a well junction property is obtained. This is because the surfaces of the silicon semiconductor chip 1 and the substrate material 2 have concave-convex and requires a predetermined quantity of liquid phase material to secure the wetting property stably. Accordingly, the thicknesses of second solder 5a and 5b are required to be above 5 microns and it is recommended up to about 10 microns with taking into consideration the amount exhausted at the junctioning.

Figure 3:
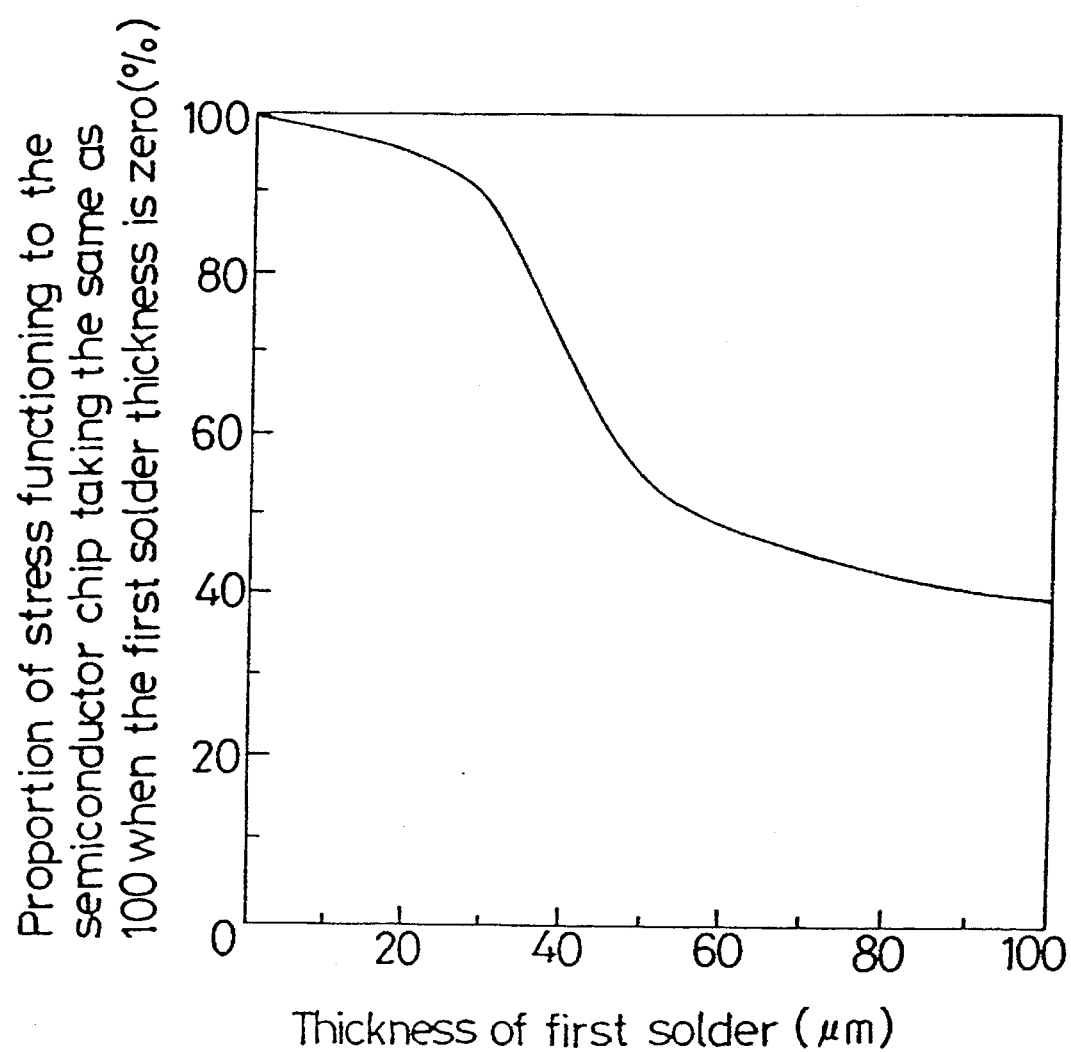
FIG. 3 is a diagram showing the characteristic of a relation between the thickness of the first solder and the proportion of stress functioning to the semiconductor chip representing the stress reduction effect according to the first embodiment of the present invention.

FIG. 3 shows a characteristics representing the relation between the thermal stress functioning to the silicon semiconductor chip and the thickness of the first solder 4. The ordinate represents the thermal stress functioning to the silicon semiconductor chip 1 when a predetermined temperature variation is given to the solder junction part and the abscissas represents the thickness of the first solder 4. As apparent from the figure, although in the range where the thickness of the first solder 4 is below 30 microns there is no large change in the thermal stress generated, the thermal stress begins to largely decrease from at the vicinity exceeding 30 microns. Therefore, the thickness of the first solder 4 is required to be above 30 microns and it is better as thick as possible for relaxing the thermal stress. When the thickness of the unction layer increases, however, the heat is difficult to be transmitted from the silicon semiconductor chip 1 to the substrate material 2 and it is required to determine the thickness of the first solder layer 4 so as to secure required thermal conductivity.

Second Embodiment

Figure 4:
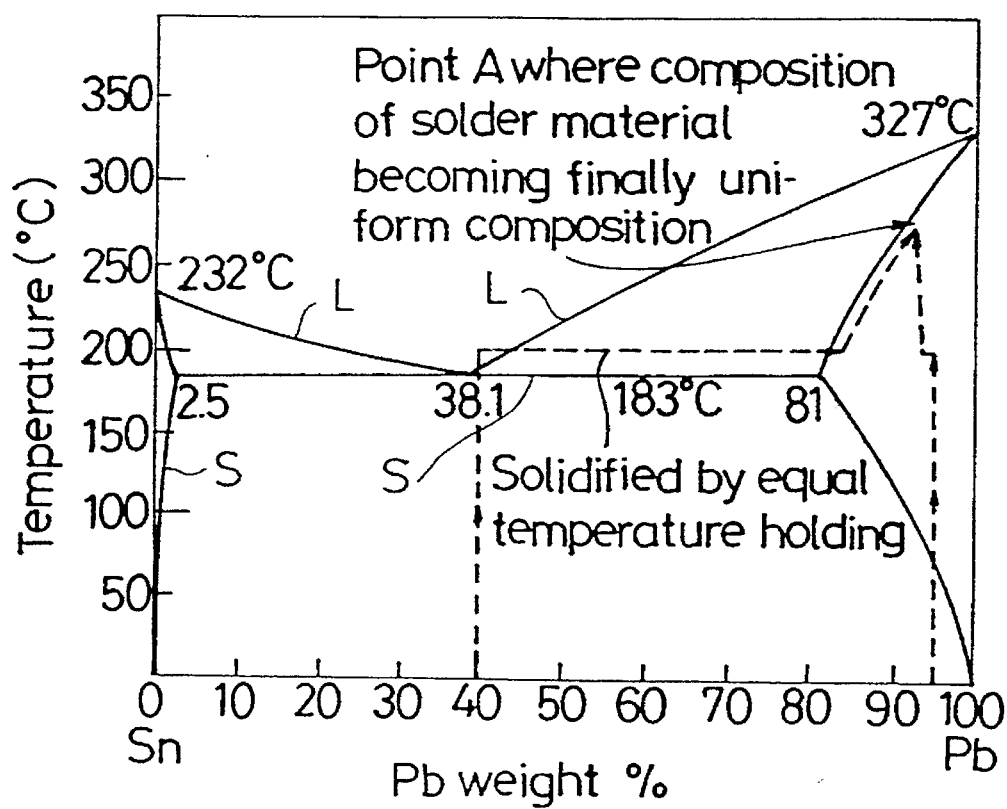
FIG. 4 is a state diagram for explaining the process of solidification of the solder according to a second embodiment of the present invention.

The silicon semiconductor chip 1 and the substrate material 2 are held via the solder materials 4, 5a, and 5b of the construction as in the first embodiment, and the solder material is heated to a temperature higher than the melting point of the second solder 5a and 5b and lower than the melting point of the first solder 4, for example 200° C., in the reductive ambient, and it is held at that temperature. By holding the device at this high temperature, Sn atoms are diffused from the second solder 5a and 5b to the first solder 4 at a relatively high speed, and as shown in the Pb-Sn system state diagram of FIG. 4, when the Sn concentration in the second solder 5a and 5b becomes lower than 18 percent (Pb concentration higher than 82 percent), it is solidified. Thereafter, the temperature is raised so that the solder material is held at a temperature directly below the solid phase line S temperature accompanying with the decrease in the Sn concentration, whereby the diffusion speed of Sn is further accelerated. As shown in FIG. 4, finally the composition of the first solder 4 and the second solder 5a and 5b becomes the same at point A, and its melting point becomes higher than that of the second solder 5a and 5b at the initial state. Therefore, a semiconductor device having an effect of keeping the interval between the silicon semiconductor chip 1 and the substrate material 2 due to that the first solder layer 4 is not melted as well as an effect of having an anti-heat property against a temperature higher than the heating temperature at the junctioning.

Third Embodiment

While in the first and the second embodiments 95Pb-5Sn is used as first solder 4 and 63Sn-37Pb is used as second solder 5a and 5b, Sn can be used as first solder 4 and 95Pb-5Sn can be used as second solder 5a and 5b with the same effect. In the third embodiment of such construction, the melting point of Sn is 232° C. and the melting point of 95Pb-5Sn is 314° C., meaning that the melting point of the second solder 5a and 5b is higher than the melting point of the first solder 4. As shown in the Sn-Pb state diagram of FIG. 5, however, when solder material comprising the first solder 4 and the second solder 5a and 5b is heated at a temperature between the melting point of Sn and the co-crystallization temperature 183° C., for example at 190° C., Sn atoms in the first solder 4 are diffused into the second solder 5a, 5b, and the liquid phase line L of the second solder 5a and 5b is lowered. When the composition of the second solder 5a and 5b becomes close to the co-crystallization point (where the melting point of the two elemental alloy amounts to the lowest temperature) and the temperature of the liquid phase line L becomes below 190° C., the second solder 5a and 5b is completely melted. When the temperature is thereafter lowered, the second solder 5a and 5b are solidified and the semiconductor chip 1 and the substrate material 2 are junctioned to each other. Then, although the first solder 4 reduces in its thickness a little by the flowing out of Sn, the thickness of the first solder 4 can be held at appropriately a predetermined thickness by previously selecting the thickness with assuming its reduction quantity.

Fourth Embodiment

Figure 5:
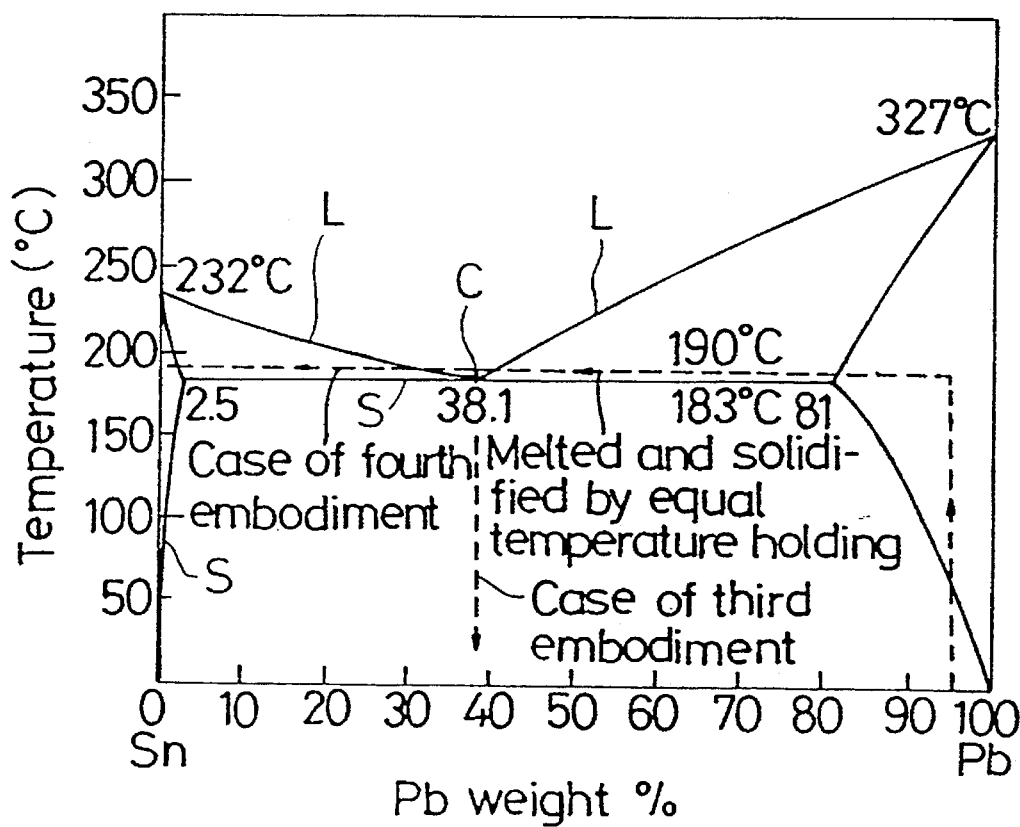
FIG. 5 is a state diagram explaining a process of melting and solidifying the solder according to a third and a fourth embodiment of the present invention.

While in the above-described third embodiment Sn is used as first solder 4 and 95Pb-5Sn is used as the second solder 5a and 5b, the solder material is heated to 190° C. to be melted, and thereafter cooled to be solidified thereby to junction the semiconductor chip 1 and the substrate material 2, it is also possible to solidify the same by transiting the composition of second solder 5a and 5b toward the side of high melting point while keeping the device at a heating temperature of 190° C., in place of carrying out solidification by cooling. As shown in FIG. 5, when the second solder 5a and 5b are further held at 190° C. after melted, Sn atoms are diffused into the second solder 5a and 5b, and as the Sn concentration increases, the liquid phase line L is gradually raised. When the Sn concentration further increases and reaches 98 percent, the Sn concentration is located at below the solid phase line S, and the second solders 5a and 5b are solidified thereby to junction the semiconductor chip 1 and the substrate material 2 to each other.

In the junctioning method according to the above-described first to fourth embodiments of the present invention, as described above, it is possible to relax the thermal stress applied to the semiconductor chip 1 by keeping the interval between the semiconductor chip 1 and the substrate 2 at a desired value. However, when the solder material is heated to a temperature such as 200° C. thereby to only melt the second solders and thereafter the solder material is kept at that temperature to diffuse Sn atoms from the second solder 5a and 5b to the first solder lowering the Sn concentration of the second solder to result in its raised solidification point and thereby enable to result in solidifying the second solder, it takes a lot of time for diffusing Sn atoms because the thickness of the second solder amounts to 10 microns.

Fifth Embodiment

FIG. 1 also shows a cross-sectional construction of a semiconductor device in accordance with a fifth embodiment of the present invention. In FIG. 1, reference numeral 4 designate first solder of high melting point comprising 95Pb-5Sn and having a thickness of 50 microns. Reference numerals 5a and 5b designate second solders produced at the both surfaces of the first solder 4 by gilding, comprising 63Sn-37Pb and having a thickness of 3 microns. The other elements 1 and 2 are the same as those shown in FIG. 1. Here, the junction surface of the semiconductor chip 1 is subjected to metalization processing.

A junctioning method for producing a semiconductor device shown in FIG. 1 will be described.

First, a semiconductor chip 1 and a lead frame 2 are overlapped with each other putting solder material comprising first solder 4 and second solder 5a and 5b therebetween, and the whole is heated by such as a heater up to a temperature 200° C. which is higher than the melting point of the second solder 5a and 5b and lower than the melting point of the first solder 4 in a reductive ambient, thereby melting the second solder 5a and 5b.

Here, the heating in the reductive ambient is conducted so that the first solder 4 and the second solder 5a and 5b are not oxidated. It may be carried out in inactive gas ambient such as argon or in vacuum.

Thereafter, the temperature is lowered to the solidify the second solder 5a and 5b thereby to junction the semiconductor chip 1 and the lead frame 2 to each other. Since the first solder 4 is almost not melted during the heating for junctioning, the first solder 4 is not exhausted to outside or transformed and is held in an initial thickness before heating processing. As a result, the interval between the semiconductor chip 1 and the lead frame 2 is held at a predetermined interval regulated by the first solder material 4.

Also in this fifth embodiment, by carrying out washing by such as organic solvent after the second solder material 5a and 5b are gilded to the first solder material 4, and carrying out a sufficient dry process to control the thickness of the oxide film at the surface of the second solder material 5a and 5b below 0.003 microns as well as controlling the oxygen concentration in the ambient in the junctioning process below 1,000 ppm, the oxidation of the solder material in the junctioning process is prevented. Thereby, even if only less liquid phase quantity of the second solder 5a and 5b having a thickness of only 3 microns is melted during the heating junctioning process due to a thin second solder 5a and 5b of 3 microns thickness, a stable wetting property can be secured at the melting junctioning.

Figure 6:
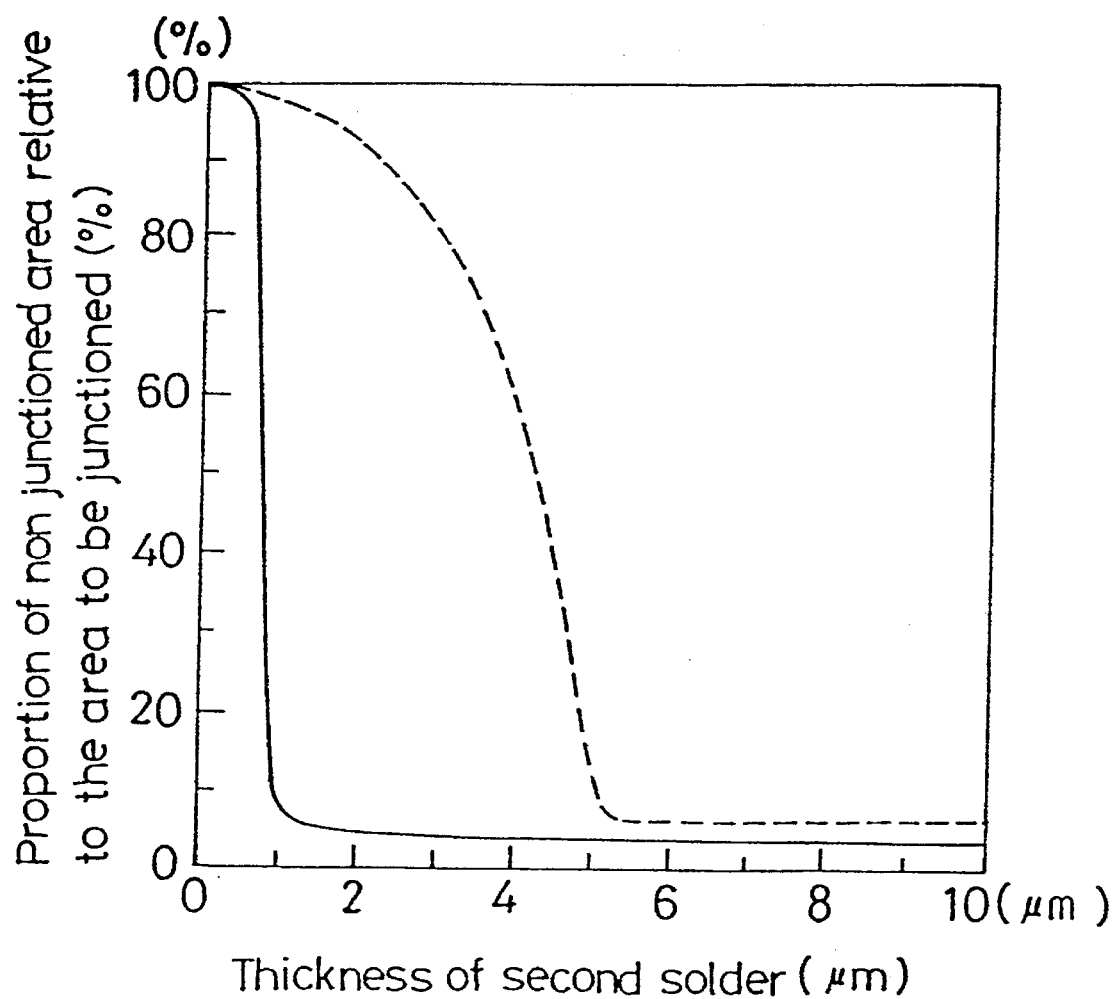
FIG. 6 is a diagram showing the characteristic of a relation between the thickness of the second solders 5a and 5b and the junctioning property according to fifth embodiment of the present invention.

FIG. 6 shows a characteristic representing a relation between the thickness of the second solder 5a and 5b and their junctioning property. The ordinate represents the proportion of the non-junctioned area relative to the area to be junctioned and the abscissas represents the thickness of the second solder 5a and 5b.

In FIG. 6, the characteristic curve represented by the real line shows the case where solder material according to this fifth embodiment, while the characteristic curve shown by broken line shows a case of the first embodiment as shown in FIG. 2.

In a case of employing the solder material in the first embodiment, as shown by broken line and as already described, the proportion of the non-junctioned area is only reduced when the thickness of the second solders 5a and 5b has exceeded 5 microns due to that the thickness of the oxide film of the solder material cannot be made thin.

In a case of employing the solder material according to this fifth embodiment, however, since the thickness of the oxide film of the solder material can be made thin to below 0.003 microns, the area of the non-junctioned portion is reduced, by only the second solder 5a and 5b having a thickness larger than 1 micron, thereby resulting in a good junction property.

While in this fifth embodiment gilding is employed as a method for providing second solder 5a and 5b at the both surfaces of the first solder 4, it is not restricted thereto and mechanical lamination or vacuum evaporation can be employed with the same effects as described above.

Sixth Embodiment

While in the above-described fifth embodiment the second solder 5a and 5b are heated to 200° C. to melt the second solder 5a and 5b and they are solidified by thereafter lowering the temperature, it is also possible to solidify the second solder 5a and 5b without lowering the heating temperature.

If the semiconductor chip 1 and the lead frame 2, and the solder material put therebetween comprising the first solder 4 and the second solder 5a and 5b are heated at a temperature of 200° C. thereby to melt the second solder 5a and 5b in the reductive ambient having oxygen concentration of below 1,000 ppm similarly as in the fifth embodiment, and it is held as it is at 200° C., Sn atoms in the second solder 5a and 5b are diffused into the first solder 4 at a relatively high speed. Here, as is apparent from the Pb-Sn state diagram shown in FIG. 4, the Pb-Sn solder is solidified when the Sn concentration becomes below 18 percent (Pb concentration above 82 percent) even at a temperature of 200° C. Therefore, when the Sn concentration of the second solder 5a and 5b becomes below 18 percent by the diffusion of Sn from the second solder 5a and 5b to the first solder 4, even it is heated at a temperature of 200° C., it is solidified.

It is also possible to further accelerate the diffusion speed of Sn by thereafter raising the temperature with controlling it at directly below the solid phrase line S temperature shown in FIG. 4.

Finally, the Sn concentration of the second solder 5a and 5b becomes the same as the Sn concentration of the first solder 4. In this state, the melting point of second solder 5a and 5b is higher than the melting point before heating processing, meaning that the anti-heat property of the second solder 5a and 5b is enhanced.

Thereby, a semiconductor device having an effect of keeping the interval between the semiconductor chip and the substrate material due to that the first solder 4 is not melted as well as an effect of having an anti-heat property against a temperature higher than the heating temperature at the junctioning can be obtained.

Figure 7:
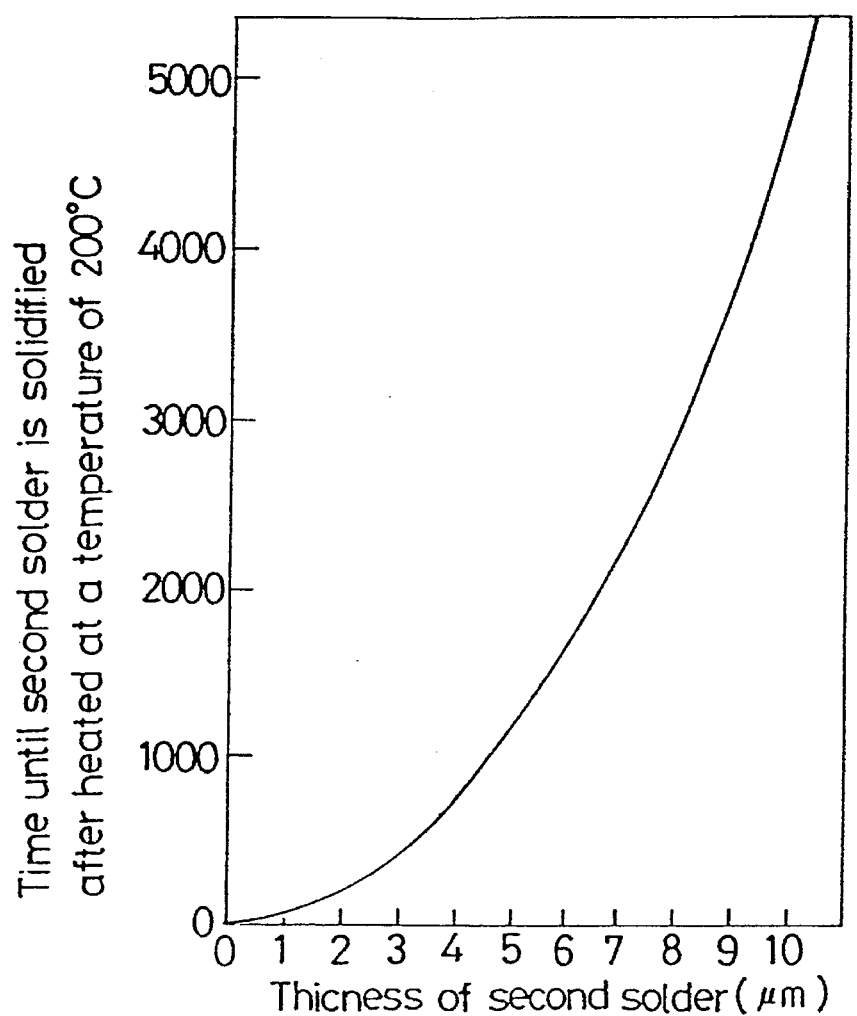
FIG. 7 is a diagram showing the relation between the thickness of the second solders 5a and 5b and its solidification time according to the sixth embodiment of the present invention.

FIG. 7 shows a diagram representing the relation between the time until the solder material is solidified due to that Sn atoms are diffused from the second solder 5a and 5b to the first solder 4 resulting in lowering of Sn concentration in the second solder 5a and 5b to below 18 percent while keeping the solder material at a high temperature of 200° C. in a case of the first solder 4 having a thickness of 100 microns and the second solder 5a and 5b having a thickness of less than 5 microns and larger than or equal to 1 micron.

In FIG. 7, the ordinate represents the time until the second solder 5a and 5b are solidified after the temperature keeping at 200° C. is started and the abscissas represents the initial thickness of the second solder 5a and 5b.

As is apparent from FIG. 7, the time until the second solder is solidified by that Sn is diffused from the second solder 5a and 5b thereby to lower the Sn concentration therein is increasing in a secondary function manner accompanying with an increase in the thickness of the second solder 5a and 5b.

Although it is required to set the thickness of the second solder 5a and 5b equal to or larger than 1 micron in order to obtain a good junction property as described in the fifth embodiment, in order to complete the junctioning process in a short time, the initial thickness of the second solder 5a and 5b is recommended to be as thin as possible on a condition that a good wetting property is obtained when it is solved.

Although the above description is concerned about the time until the second solder 5a and 5b are solidified, the same (that the time can be shortened) is applied to the time required until that the second solder 5a and 5b become to have the same composition as the first solder 5a and to have a higher melting point that of the composition of the initial second solder 5a and 5b after they are solidified as described above.

Figure 20:
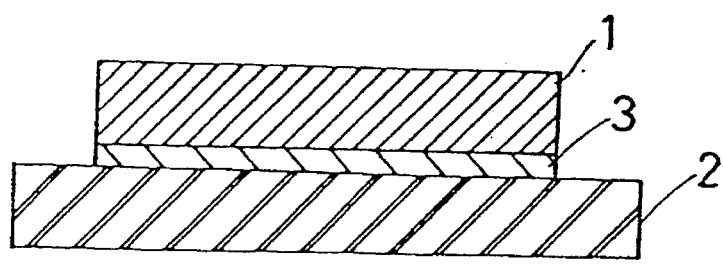
FIG. 20 is a schematic diagram showing a prior art semiconductor device.

In such an alternative of this sixth embodiment, a junction portion having an anti-heat property against a temperature higher than the heating temperature at the junctioning is obtained, and junctioning at a lower temperature can be conducted than the case where a junction portion having a similar anti-heat property is to be obtained employing the single composition solder 3 (refer to FIG. 20).

That is, while when junctioning is carried out by employing a solder 3 as shown in FIG. 20 so as to secure the anti-heat property against 280° C., heating at a temperature higher than 280° C. with a solder material of a composition having a melting point of 280° C. is required, in the case of this seventh embodiment, by conducting melting and junctioning at a temperature lower than 200° C. and keeping the temperature for a predetermined time, a junction portion having an anti-heat property against 280° C. is obtained.

In more detail, in a case where solder material comprising first solder 4 having a composition of 95Pb-5Sn and a thickness of 100 microns and second solders 5a and 5b provided at the both surfaces thereof, having a composition of 63Pb-37Sn and a thickness of 4 microns is employed to conduct die-bonding of the semiconductor chip 1 onto the lead frame 2, the whole is heated at a temperature of 190° C. which is higher than the melting point 183° C. of the second solder 5a and 5b thereby to conduct melting and junctioning, and thereafter it is kept at a temperature of 190° C.

Thereby, Sn in the second solder 5a and 5b are diffused into the first solder 4 and the Sn concentration in the second solder 5a and 5b are lowered to be approximately the same composition as that of the first solder 4.

When the Sn concentration of the Pb-Sn solder becomes in the vicinity of 5 percent, its melting point becomes above 280° C. as is apparent from FIG. 4, and therefore the second solder 5a and 5b become to have an anti-heat property against 280° C. and also the junction portion between the semiconductor chip 1 and the lead frame 2 becomes to have an anti-heat property against 280° C.

By the way, because the thermal stress functioning to the semiconductor chip 1 is a product of the difference in the thermal expansion coefficient between the semiconductor chip 1 and the lead frame 2a and the temperature difference arising at the junctioning, as the heating temperature at the junctioning is lower, the heat stress functioning to the semiconductor chip 1 is lower. Therefore, if an anti-heat property against 280° C. is obtained by the junctioning conducted at 190° C., the residual heat stress at 250° C. is reduced by about 35 percent with relative to a case where the junctioning is conducted at 280° C. employing a solder material of single composition as in the prior art.

From this characteristic, a sufficient effect of reducing thermal stress is obtained by reducing the interval between the semiconductor chip 1 and the substrate material 2 to about 20 microns depending on the combination of the semiconductor chip 1 and the substrate material 2. When the thickness of the first solder 4 is too thin, however, it is difficult to keep its flatness, therefore its thickness is required to be above 10 microns.

While in the above illustrated embodiments a silicon semiconductor chip is die-bonded onto a copper system lead frame, the present invention is not limited thereto and can be generally applied to a junctioning of a weak compound semiconductor chip or electronic part to a substrate material with the same effects as described above.

While in the above illustrated fifth and sixth embodiments a combination of 95Pb-5Sn solder and 63Sn-37Pb solder is described, as the first solder 4 in FIG. 6, an alloy having Pb, In, or Sn or Au as main constituent can be employed, not limited to Pb-Sn alloy.

Further, as second solder material, an alloy having a melting point lower than the first solder 6 material or an alloy which reacts with the first solder 6 thereby to produce an alloy having a lower melting point than the first solder can be employed. For example, Pb for first solder 4 and Sn for second solder 5a and 5b can be employed, and they are not restricted to the alloy of the above embodiment.

In order to shorten the process time in a case where atoms are diffused from the second solder 5a and 5b to the first solder 6 thereby to occur solidification while the solders are kept at a temperature at which the second solder 5a and 5b are in a melted state, It is also effective to add to the second solder material, element such as Cu, Zn, Au, Ni, Co, or Ag that can increase the diffusion coefficient.

In the above-described fifth and sixth embodiments of the present invention, a junctioning material is constituted by a first solder and a second solder provided at the both surfaces of the first solder having a lower melting point than the first solder. This construction makes it easy to keep the interval between the materials to be junctioned at a predetermined interval and also enables reduction in the thermal stress applied between the materials to be junctioned as well as suppressing the damages thereto.

Furthermore, the above-described construction makes it possible to enhance the positional preciseness between the materials to be junctioned and shorten the time for the junctioning process, and further provide a high anti-heat property against a temperature higher than the processing temperature at the junctioning.

In the above-described junctioning material according to the fifth and sixth embodiments of the present invention, however, the low temperature state has to be kept for a long time until completing the junctioning due to that the diffusion between the high melting point solder and the low melting point solder is slow, thereby resulting in a large factor of lowering the yield in the production.

Seventh Embodiment

Figure 8:
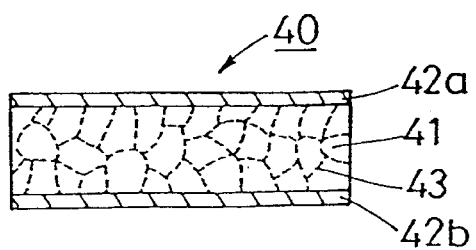
FIG. 8 is a schematic diagram showing a junction material according to a seventh embodiment of the present invention.

FIG. 8 shows a cross-sectional view illustrating a junction material 40 employing solder according to a seventh embodiment of the present invention. The junction material 40 of this seventh embodiment includes a high melting point solder layer 41 and low melting point solder layers 42a and 42b. The high melting point solder layer 41 comprises solder having a high melting point and constituted in a structure including spaces 43 therein (illustrated by broken line in FIG. 8) continuously provided from its front surface to its rear surface. The low melting point solder layers 42 are provided at the front surface and the rear surface thereof. The low melting point solder layers 42 comprise solder having a lower melting point than the melting point of the high melting point solder layer 41. Heinbelow, this definition is commonly assumed in subsequent embodiments. Further, because solders having such a relation of melting point are well known, the explanation thereof are omitted. Further, the spaces inside the high melting point solder layer 41 can be produced by a known method.

In the above described construction, the solder layers are heated at a temperature higher than the melting point of the low melting point solder 42a and 42b and lower than the melting point of the high melting point solder 41, the low melting point solder layers 42a and 42b are melted and portions of them in the melted state other than the quantity required for junctioning the semiconductor chip onto the substrate material are soaked into the spaces inside the high melting point layer 41. Thereby, the low melting point solder between the semiconductor chip and the high melting point solder layer 41 and the low melting point solder between the high melting solder layer 41 and the substrate material are suppressed in their quantity to the minimum quantity required, respectively, and the excess low melting solders are soaked into the spaces 43 inside the high melting point solder layer 41, thereby increasing the diffusion interface of the solder. Therefore, when heating is carried out in the junction material 40 of such structure, the solder is mutually diffused between the low melting point solder layer 42 and the high melting point solder layer 41 to make the composition of the whole uniform, thereby enabling shortening the heating time until the junctioning between the semiconductor chip and the substrate material is completed.

Eighth Embodiment

Figure 9:
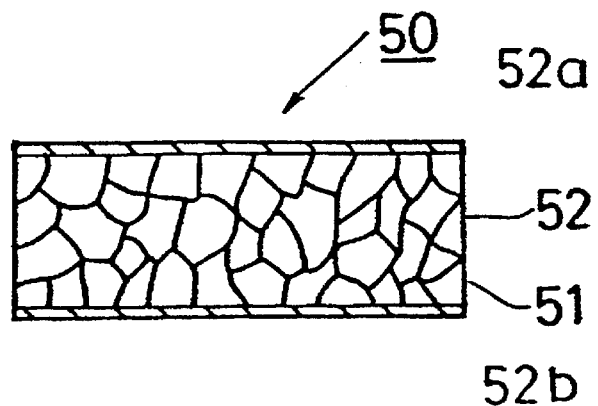
FIG. 9 is a schematic diagram showing a junction material according to an eighth embodiment of the present invention.

FIG. 9 shows a cross-sectional view illustrating the junctioning material 50 according to an eighth embodiment of the present invention. The junctioning material 50 illustrated in the figure is constituted by a porous high melting point solder 51 and low melting point solder 52 provided in the spaces inside the high melting point solder 51. This solder material is obtained by heating the solder material of seventh embodiment of FIG. 8 for a short time. There are also remaining a thin low melting point junction material layers 52a and 52b at the both surfaces of the high melting point junction material layer 52. While the space is illustrated by broken line in the seventh embodiment shown in FIG. 8, low melting point solder is filled up with in the space in this eighth embodiment due to the heating for the short time and the portion corresponding to the broken line is illustrated by real line to show the state where the low melting point solder is filled up with. The junctioning material 50 of such construction is subjected to a heating processing at a temperature higher than the melting point of the low melting point solder 52 and lower than the melting point of the high melting point solder 51, resulting in the same function and effect as described in the above described seventh embodiment of the present invention.

Ninth Embodiment

Figure 10:
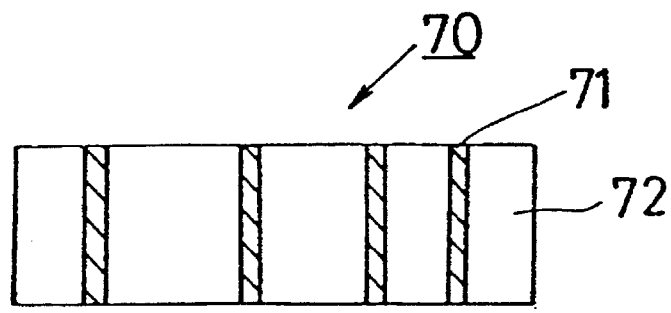
FIG. 10 is a schematic diagram showing a junction material according to a ninth embodiment of the present invention.

FIG. 10 shows a cross-sectional view illustrating a junctioning material according to a ninth embodiment of the present invention. The junction material 70 illustrated in the figure is constituted in a multi-layer structure in which the low melting point solder layer 71 and high melting point solder layer 72 are alternatively laminated in the direction vertical to the direction junctioning the semiconductor chip and the substrate material, so as to perform wetting and broadening of solder only to a portion required to obtain the minimum intensity required for the junctioning between the semiconductor chip and the substrate material, and the quantity of the low melting point solder layer 71 required between the semiconductor chip and the high melting point solder layer 72 and that of the low melting point solder layer 71 required between the high melting point solder layer 72 and the substrate material are reduced. In addition, diffusion interfaces between the low melting point solder layer 71 and the high melting point solder layer 72 are provided in plural, thereby resulting in the same function and effect as in the above seventh to ninth embodiments.

Tenth Embodiment

Figure 11:
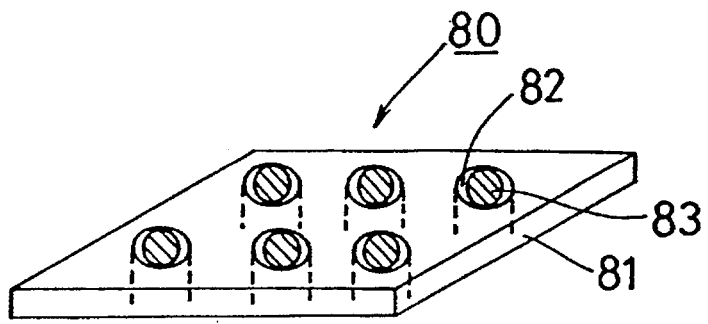
FIG. 11 is a schematic diagram showing a junction material according to an tenth embodiment of the present invention.

FIG. 11 shows a perspective view illustrating a junction material 80 according to a tenth embodiment of the present invention. The junction material 80 illustrated in the figure is provided by placing a sheet shaped high melting point solder layer 81 on the substrate material, providing a plurality of throughholes 82 at appropriate positions of the high melting solder layer 81, and supplying low melting point solder 83 in sphere shapes to the throughholes 82 of the high melting point solder layer 81. By placing a semiconductor chip thereon and conducting heating, the low melting point solder 83 is melted to wet and broaden to the both sides of the high melting point solder layer. Thereby, the diffusion area of the low melting point solder 83 increases and the same function and effect as described in the above seventh to ninth embodiments are obtained.

Eleventh Embodiment

Figure 12:
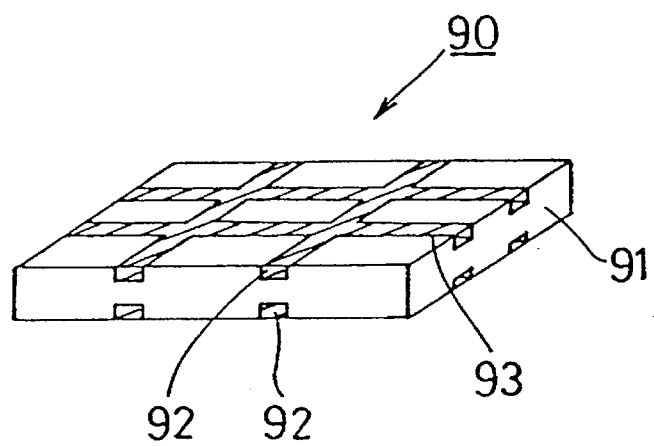
FIG. 12 is a schematic diagram showing a junction material according to a eleventh embodiment of the present invention.

FIG. 12 shows a perspective view illustrating a junction material 90 according to a eleventh embodiment of the present invention. The junctioning material 90 illustrated in the figure is constituted by providing grooves in mesh configuration 92 at the both surfaces of the high melting point solder layer 91 and providing low melting point solder 93 inside the grooves 92. Thereby, the quantity of the low melting point solder 93 at the junctioning surface is reduced and by that the low melting solder 93 is buried in the grooves 92 of the high melting point solder layer 91, the diffusion area is increased, resulting in the same function and effect as in the above seventh to tenth embodiments.

Twelfth Embodiment

Figure 13:
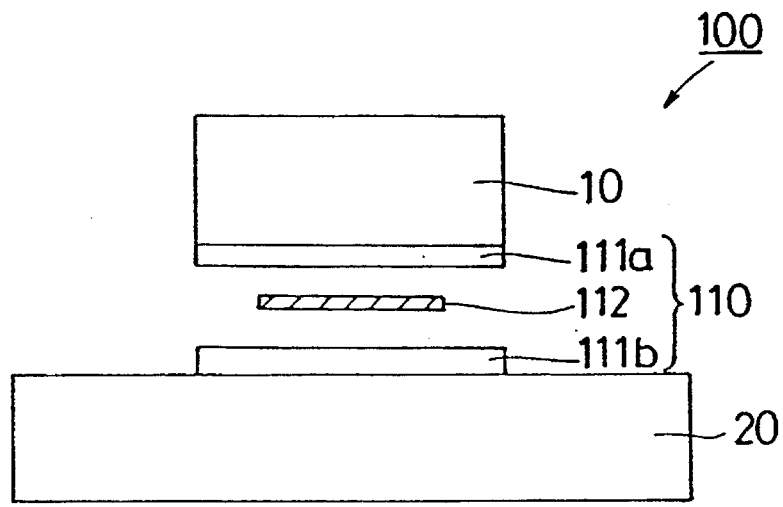
FIG. 13 is a schematic diagram showing a semiconductor device according to a twelfth embodiment of the present invention.

FIG. 13 shows a cross-sectional view showing a semiconductor device 100 according to a twelfth embodiment of the present invention. The semiconductor device 100 illustrated in the figure have a semiconductor chip 10 and a substrate material 20 and the both 10 and 20 are junctioned to each other via the junction material 110. The junction material 110 comprises a high melting point solder layer 111b provided at the front surface of the substrate material 20 and a high melting point solder layer 111a provided at the rear surface of the semiconductor chip 10, and a low melting point solder layer 112 is inserted between the both 111b and 111a. By that the low melting point solder layer 112 is heated to a temperature lower than the high melting point solder layer 111a and 111b, the low melting point solder layer 112 is melted, the low melting point solder layer 112 wets and broadens in quite thin and uniformly between the high melting point solder layer 111a and 111b in solid phase, resulting in a reduction in the supplying quantity of the low melting point solder layer 112. Also by conducting diffusion in the two directions of upward and downward directions, the time required for the thermal processing is shortened, resulting in the same function and effect as the above-described seventh to eleventh embodiments.

Thirteenth Embodiment

Figure 14:
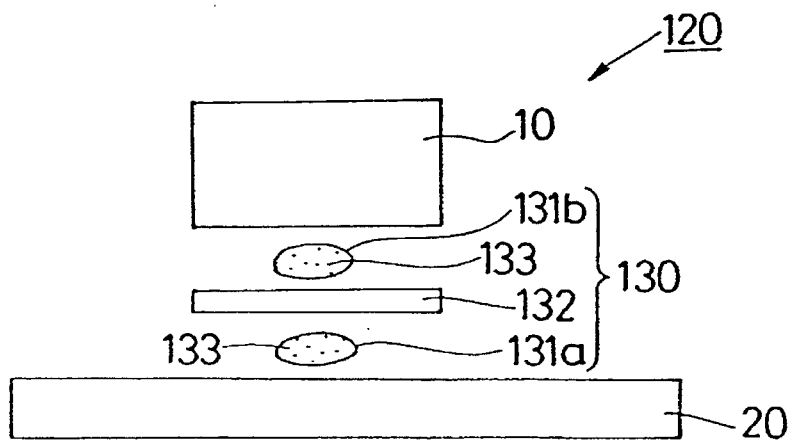
FIG. 14 is a schematic diagram showing a semiconductor device according to a thirteenth embodiment of the present invention.

FIG. 14 shows a cross-sectional view illustrating a semiconductor device 120 according to a thirteenth embodiment of the present invention. The semiconductor device 120 illustrated in the figure includes a semiconductor chip 10 and a substrate material 20, and the both 10 and 20 are junctioned to each other by the junction material 130. The junction material 130 is constituted by volatile solvent 131a, 131b, high melting point solder layer 132, and minute low melting point solder particles 133 provided in the volatile solvent 131a and 131b. By dropping an appropriate quantity of volatile solvent 131a including minute low melting point solder particles 133 on the substrate material 20 and placing high melting point solder layer 132 thereon, further dropping the above described solvent 131b including the above described solder particles 133 thereon, placing the semiconductor chip 10 thereon, and thereafter carrying out heating as in the twelfth embodiment, the volatile solvent 131a and 131b are evaporated, and the remaining minute low melting point solder particles 133 are made in melted state to wet and broaden uniformly and thinly between the semiconductor chip 10 and the high melting point solder layer 132 and between the high melting point solder layer 132 and the substrate material 20. Thereby, the shortening of the thermal processing time is accomplished as well as no unfavorable influences are affected on the reliability of the semiconductor device 120 by that the volatile solvent 132 are evaporated, resulting in the same function and effect as in the above described seventh to thirteenth embodiments.

As described above, according to the seventh to thirteenth embodiments of the present invention, by that the configuration of the junction material and the supplying method thereof in junctioning a semiconductor chip onto a substrate material are improved, the thermal processing time required for fixing a semiconductor chip to a substrate material is shortened.

Fourteenth Embodiment

In the above-described junctioning method of first to sixth embodiments of the present invention, the melted low melting point solder flows out to the outside from the interface between the semiconductor chip 1 and the substrate material 7 due to the die-bonding load, thereby producing an excess low melting point solder. This excess low melting point solder 5 requires a long time heating to diffuse the same, and if there remains a portion not diffused, the excess portion is again melted at the later wire bonding and molding process, resulting in that the excess solder is exhausted onto the interface between the semiconductor chip or the substrate material and the Solder material of the triple-layer structure, leading to probability of occurring its peeling off.

Figure 15:
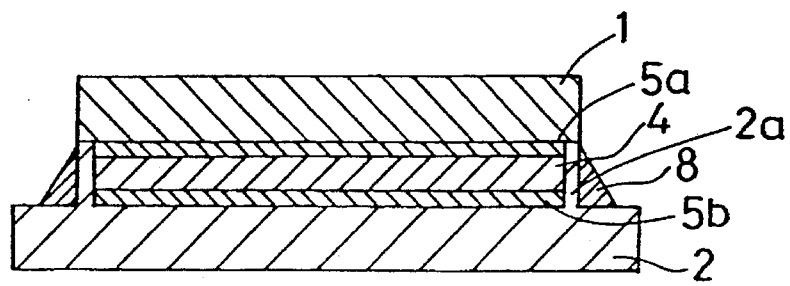
FIG. 15 is a schematic diagram showing a fourteenth embodiment of the present invention.
Figure 16:
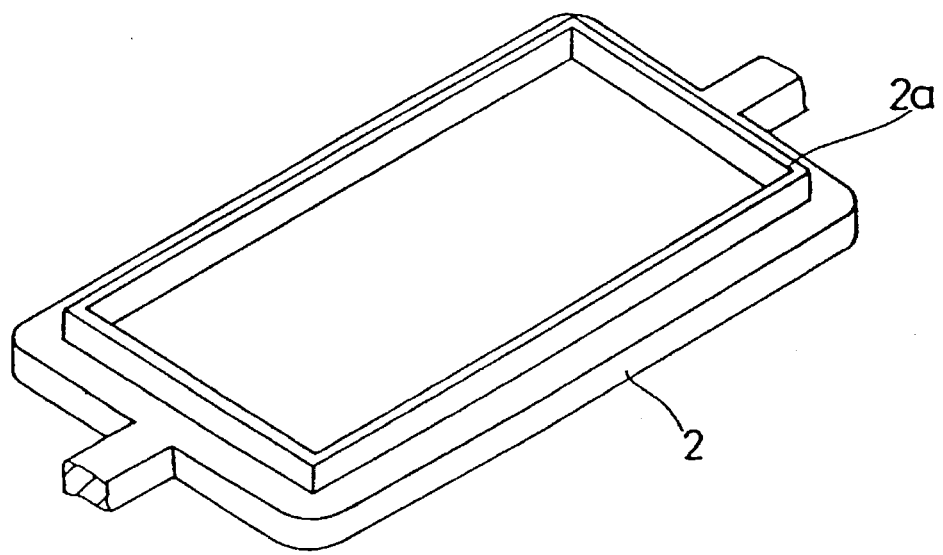
FIG. 16 is a perspective view showing the substrate material having peripheral projecting part according to the fourteenth embodiment of the present invention.
Figure 18:
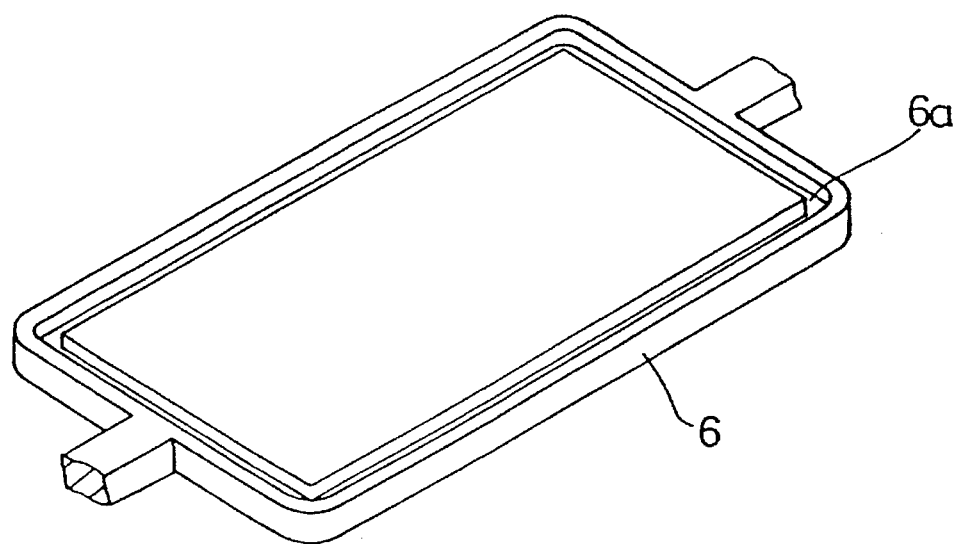
FIG. 18 is a perspective view showing the substrate material having a groove according to the fifteenth embodiment of the present invention.

FIG. 15 is a cross-sectional view showing a fourteenth embodiment of the present invention and FIG. 18 is a perspective view showing a substrate material according to this fourteenth embodiment of the present invention. In the figure, reference numeral 1 designates a semiconductor chip, and reference numeral 2 designates a substrate material such as a copper lead frame. Reference numeral 4 designate a high melting point solder as mother material of solder material. Reference numeral 5a and 5b designate low melting solder provided at the both surfaces of the mother material to constitute a triple layer structure solder material. Reference numeral 8 designates an excess low melting point solder which has flown out to the side surface due to the die-bonding load. A peripheral projecting part 2a for separating the excess low melting point solder 8 from the solder materials 3, 5a and 5b are produced at the peripheral portion of substrate material 2. FIG. 18 shows a perspective view illustrating a substrate material of the semiconductor device according to the fourteenth embodiment of the present invention.

In the semiconductor device of this fourteenth embodiment, a semiconductor chip 1 and a substrate material 2 are applied by pressure, with putting the solder material 4, 5a and 5b therebetween, and the low melting point solder 5a and 5b are melted by heating the whole at a temperature higher than the melting point of the low melting point solder and lower than the melting point of the high melting point solder in the reductive ambient, and thereafter the temperature is kept as it is thereby to diffuse Sn in the low melting point solder 5a and 5b to the high melting point solder 4, and finally the high melting point solder 4 and the low melting point solder 5a and 5b become to have the same composition, thereby to generate solder of a higher melting point than the heating temperature, and thus the semiconductor chip 1 and the substrate material 2 are junctioned to each other. Then, the excess low melting point solder 5 which has flown out by the applied pressure is separated by the peripheral projecting part 2a from the side surfaces of the solder material 4, 5a and 5b, which are provided on the substrate material 2 so as to surround four edges of the solder material 4, 5a and 5b.

In this fourteenth embodiment, because the excess low melting point solder is not in contact with the side surface of the solder material, the diffusion of excess low melting point solder is not required, thereby enabling shortening the bonding time, and further the peeling off of the semiconductor chip in the later wire bonding and molding process can be prevented.

Fifteenth Embodiment

Figure 17:
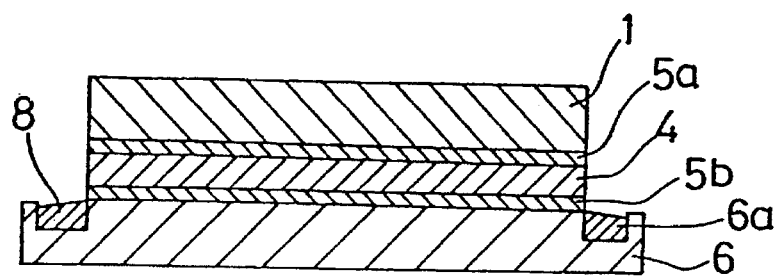
FIG. 17 is a schematic diagram showing a semiconductor device according to a fifteenth embodiment of the present invention.

FIG. 17 is a cross-sectional view showing a semiconductor device according to a fifteenth embodiment of the present invention and FIG. 20 is a perspective view showing a substrate material of the semiconductor device according to this fifteenth embodiment. While in the above described fourteenth embodiment peripheral projecting part 2a is produced on the substrate material, in this sixteenth embodiment, a groove part is produced at the surrounding of the solder material 3, 4a and 4b as shown in the substrate material 6 of FIG. 20. The excess low melting point solder 5 which has flown out due to the die-bonding load flows into the groove and it is prevented from remaining at a side surface of the solder material 3, 4a and 4b. In this way, although in this fifteenth embodiment of the present invention excess low melting point solder does not contact with the side surface of the solder material, resulting in the same effect as the above described fourteenth the embodiment.

Sixteenth Embodiment

Figure 19:
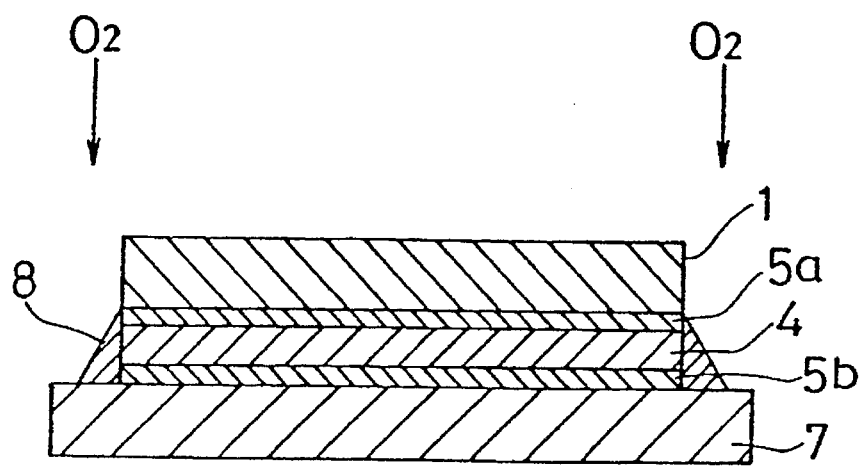
FIG. 19 is a schematic diagram showing a semiconductor device according to a sixteenth embodiment of the present invention.

FIG. 19 shows a junctioning method according to a sixteenth embodiment of the present invention. In this sixteenth embodiment, the semiconductor chip 1 and the substrate material 7 are applied by pressure, with putting the solder materials 4, 5a and 5b therebetween, and heating is carried out at a temperature higher than the melting point of the low melting point solder and lower than the melting point of the high melting point solder in the reductive ambient, thereby to melt the low melting point solder 5a and 5b, and thereafter keeping the temperature as it is to diffuse Sn in the low melting point solder 5a and 5b into the high melting point solder 4. Finally, the high melting point solder 4 part and the low melting point solder 5a and 5b part become to have the same composition, thereby to produce a solder having a higher melting point than the heating temperature. Thereafter, an oxidizing process is conducted employing $O_2$ gas as shown in FIG. 21 at the time of concluding the diffusion of the low melting point solder 5a and 5b, to a non-diffused portion of the excess low melting point solder 8 which has flown out by the pressure applied at the time when the semiconductor chip 1 and substrate material 7 are junctioned to each other, thereby making the melting point of the flown out excess low melting point solder higher, thereby to result in its solidification. Since the melting point of the excess low melting point solder 5a, 5b is made higher, a long time processing for diffusing the excess low melting point solder 8 is not required and the peeling off of the semiconductor chip 1 due to the re-melting is prevented.

According to the fourteenth to sixteenth embodiments of the present invention, by making excess low melting point solder no in contact with the side surface of solder material or oxidizing to solidify the excess low melting point solder at the side surface of the solder material, the diffusion of the excess low melting point solder is not required thereby to enable-shortening the bonding time and further peeling off of the semiconductor chip in the later wire bonding and molding process can be prevented.

What is claimed is:

1. A solder material comprising:
   a first solder plate having a first surface, a second surface and a melting point; and
   a pair of second solder plates having a thickness greater than 2 microns disposed on said first and second surfaces of said first solder plate, respectively, comprising a material selected from the group consisting of a material having a lower melting point than said first solder plate and a material which reacts with said first solder plate to produce an alloy having a lower melting point than said first solder plate, wherein said first solder plate and said pair of second solder plates each comprise an alloy of materials selected from the group consisting of lead, indium and tin, and wherein said pair of second solder plates further comprise materials selected from the group consisting of copper, zinc, cobalt and mixtures thereof.

2. A solder material as defined in claim 1 wherein said pair of second solder plates have a combined thickness of greater than 5 microns.

3. A solder material as defined in claim 1 wherein said first solder plate has a thickness of at least 30 microns.

4. A solder material as defined in claim 1 wherein said first solder plate has a thickness of at least 30 microns.

5. A solder material as defined in claim 1, wherein said first solder plate comprises an alloy of about 95% by weight lead and about 5% by weight tin, and said pair of second solder plates comprise an alloy of about 63% by weight tin and about 37% by weight lead.

6. A joining method comprising:
   providing a first solder plate having a first surface, a second surface and a first melting point;
   disposing on each of said first and second surfaces of said first solder plate, respectively, a second solder plate having a second melting point, wherein each of said second solder plates has a thickness greater than 2 microns, and comprises a material selected from the group consisting of a material having said second melting point lower than said first melting point and a material which reacts with said first solder plate to produce an alloy having a melting point lower than said first melting point, wherein said first solder plate and said pair of second solder plates each comprise an alloy of materials selected from the group consisting of lead, indium and tin, and wherein said pair of second solder plates further comprise materials selected from the group consisting of copper, zinc, cobalt and mixtures thereof;
   inserting said first solder plate and said second solder plates between two objects to be joined to each other;
   heating said first solder plate and said second solder plates to a temperature between said first and second melting points thereby to melt said second solder plates; and
   solidifying at least said second solder plates thereby to join said objects.

7. A junctioning method as defined in claim 6, wherein said first solder plate comprises an alloy of about 95% by weight lead and about 5% by weight tin, and said pair of second solder plates comprise an alloy of about 63% by weight tin and about 37% by weight lead.

8. A junctioning method as defined in claim 6 wherein said pair of second solder plates have a combined thickness greater than 5 microns.

9. A junctioning method as defined in claim 6 wherein said first solder plate has a thickness of at least 30 microns.

10. A junctioning method as defined in claim 6 wherein said first solder plate has a thickness of at least 30 microns.

11. A method for joining a semiconductor chip to a substrate material, comprising:

applying a first high melting point junction material layer to a surface of said semiconductor chip and a high melting point junction material layer to a surface of said substrate material opposite said surface of said semiconductor chip, the first and second high melting point materials each being formed from an alloy of materials selected from the group consisting of lead, indium and tin;

inserting a low melting point junction material layer having a melting point less than 300° C. between said first and second high melting point junction material layers the low melting point material being formed from an alloy of materials selected from the group consisting of lead, indium and tin and further comprising a material selected from the group consisting of copper, zinc, cobalt and mixtures thereof; and heating said first and second high melting point junction material layers and said low melting point junction material layer to a temperature lower than a melting point of said high melting point junction material layers to melt said low melting point junction material layer, thereby to diffuse said low melting point material layer to said first and second high melting point junction material layers.

12. A semiconductor device made according to a process comprising the steps of:

inserting a high melting point junction material layer having first and second surfaces between a semiconductor chip and a substrate;

applying a liquid comprising a volatile solvent and minute quantities of low melting point junction material particles between a surface of said semiconductor chip and the first surface of said high melting point junction material layer and between the second surface of said high melting point junction material layer and a surface of said substrate; and heating said semiconductor chip, said substrate, said high melting point junction material layer, said solvent, and said low melting point junction material particles to a temperature lower than a melting point of said high melting point junction material layer to melt said low melting point junction material particles to make said low melting point junction material particles diffuse into said high melting point junction material layer.

13. A semiconductor device comprising a semiconductor chip and a substrate material, said semiconductor chip and said substrate material being junctioned by the method of claim 11.

14. A material used for joining a semiconductor chip to a substrate material, comprising:

at least one high melting point junction material layer and at least one low melting point junction material layer laminated alternatively in a direction that is orthogonal to a direction of joining between a surface of said semiconductor chip and a surface of said substrate material, the high melting point material having a higher melting point than the low melting point material, the low melting point material being formed from a first alloy of materials selected from the group consisting of lead, indium and tin and further comprising a material selected from the group consisting of copper, zinc, cobalt and mixtures thereof, and wherein the high melting point material is formed from a second alloy of materials selected from the group consisting of lead, indium and tin.

15. A junction material as defined in claim 14, wherein said at least one high melting point junction material layer and said at least one low melting point junction material layer each comprise an alloy of lead and tin.

16. A junction material as defined in claim 15, wherein said at least one high melting point junction material layer comprise an allow of about 95% by weight lead and about 5% by weight tin, and said at least one low melting point junction material layer comprise an alloy of about 63% by weight tin and about 37% by weight lead.

17. A junction material as defined in claim 14, wherein said at least one high melting point junction material layer comprise tin and said at least one low melting point junction material layer comprise an alloy of lead and tin.

18. A junction material as defined in claim 17, wherein said at least one low melting point junction material layer comprise an alloy of about 95% by weight lead and about 5% by weight tin.

19. A semiconductor assembly comprising a semiconductor chip and a substrate material made by a process comprising the steps of:

providing a first solder plate having a first surface, a second surface, and a first melting point, the first solder plate being formed from a first alloy of materials selected from the group consisting of lead, indium and tin;

disposing on each of said first and second surfaces of said first solder plate, respectively, a second solder plate having a second melting point, wherein each of said second solder plates has a thickness greater than 2 microns and comprises a second alloy of materials selected from the group consisting of lead, indium and tin, wherein said second alloy further comprises a material selected from the group consisting of copper, zinc, cobalt and mixtures thereof, said second alloy being selected from the group consisting of a material having said second melting point lower than said first melting point and a material which reacts with said first solder plate to produce an alloy having a melting point lower than said first melting point;

inserting said first solder plate and second solder plates between said semiconductor chip and said substrate material;

heating said first solder plate and said second solder plates to a temperature between said first and second melting points thereby to melt said second solder plates; and solidifying at least said second solder plates thereby to join said semiconductor chip and said substrate material to each other.

* * * * *

UNITED STATES PATENT AND TRADEMARK OFFICE

CERTIFICATE OF CORRECTION

PATENT NO. : 5,609,287
DATED : March 11, 1997
INVENTOR(S): Goro Izuta, Shunichi Abe, Yoshirou Nishinaka, Katsuyuki Fukutome, Naoto Ueda, Toshio Takeuchi, Yoshihiro Kashiba and Masaaki Namatame It is certified that error appears in the above-identified patent and that said Letters Patent is hereby corrected as shown below:

On the title page, item:

[73] Assignee: add -- and Ryoden Semiconductor System Engineering Corporation, Hyogo-ken, Japan --

Signed and Sealed this

Ninth Day of September, 1997

*Attest:*

BRUCE LEHMAN

*Attesting Officer*     Commissioner of Patents and Trademarks